United States Patent
Kim et al.

(10) Patent No.: US 11,367,944 B2
(45) Date of Patent: Jun. 21, 2022

(54) WIDE-BAND ANTENNA AND ELECTRONIC DEVICE INCLUDING THE SAME

(71) Applicant: Samsung Electronics Co., Ltd., Gyeonggi-do (KR)

(72) Inventors: Taegyu Kim, Gyeonggi-do (KR); Kyungbae Ko, Gyeonggi-do (KR); Un Kim, Gyeonggi-do (KR); Sanguk Kim, Gyeonggi-do (KR); Donghwan Kim, Gyeonggi-do (KR); Yongsub Lee, Gyeonggi-do (KR)

(73) Assignee: Samsung Electronics Co., Ltd

( * ) Notice: Subject to any disclaimer, the term of this patent is extended or adjusted under 35 U.S.C. 154(b) by 133 days.

(21) Appl. No.: 16/861,800

(22) Filed: Apr. 29, 2020

(65) Prior Publication Data
US 2020/0350660 A1  Nov. 5, 2020

(30) Foreign Application Priority Data
May 3, 2019 (KR) .......................... 10-2019-0052637

(51) Int. Cl.
*H01Q 1/24* (2006.01)
*H05K 5/00* (2006.01)
(Continued)

(52) U.S. Cl.
CPC .............. *H01Q 1/242* (2013.01); *H01Q 1/48* (2013.01); *H01Q 1/50* (2013.01); *H01Q 5/20* (2015.01);
(Continued)

(58) Field of Classification Search
CPC ............. H01Q 1/22; H01Q 1/242–243; H01Q 1/48–50; H01Q 5/20–30
See application file for complete search history.

(56) References Cited

U.S. PATENT DOCUMENTS

2013/0106665 A1  5/2013  Hill et al.
2018/0034135 A1*  2/2018  Kwak ...................... H01Q 1/48
(Continued)

FOREIGN PATENT DOCUMENTS

KR  1020180013615  2/2018
WO  WO 2015099442  7/2015

OTHER PUBLICATIONS

International Search Report dated Aug. 26, 2020 issued in counterpart application No. PCT/KR2020/005774, 8 pages.

*Primary Examiner* — Hasan Z Islam
(74) *Attorney, Agent, or Firm* — The Farrell Law Firm, P.C.

(57) ABSTRACT

An electronic device includes a housing including a first plate disposed to be oriented in a first direction, a second plate disposed to be oriented in a second direction opposite the first direction, and a side member surrounding a space between the first plate and the second plate and coupled to or integrally formed with the second plate; a display visible through at least part of the first plate; a printed circuit board (PCB) disposed in the space and including a ground; a first conductive pattern disposed between the PCB and the second plate and including a first portion and a second portion spaced apart from the first portion; a second conductive connection member disposed between the second portion and the PCB; and a radio frequency (RF) communication circuit electrically connected with the first conductive connection member and configured to transmit or receive at least one signal having a predetermined frequency. The PCB may include a first conductive path electrically connecting the RF communication circuit and the first portion; a second conductive path electrically connecting a first position of the ground and the second portion; a third conductive path electrically connecting the first portion and a second position (Continued)

of the ground; and a fourth conductive path electrically connecting the first portion and a third position of the ground.

17 Claims, 19 Drawing Sheets

(51) Int. Cl.
    *H05K 5/02*           (2006.01)
    *H05K 7/14*           (2006.01)
    *H05K 1/02*           (2006.01)
    *H01Q 1/50*           (2006.01)
    *H01Q 9/04*           (2006.01)
    *H01Q 1/48*           (2006.01)
    *H01Q 5/20*           (2015.01)

(52) U.S. Cl.
    CPC ........... *H01Q 9/045* (2013.01); *H05K 1/0243* (2013.01); *H05K 5/0017* (2013.01); *H05K 5/0217* (2013.01); *H05K 7/1427* (2013.01); *H05K 2201/10083* (2013.01); *H05K 2201/10098* (2013.01); *H05K 2201/10121* (2013.01); *H05K 2201/10151* (2013.01); *H05K 2201/10189* (2013.01)

(56) References Cited

U.S. PATENT DOCUMENTS

| | | |
|---|---|---|
| 2018/0034148 A1 | 2/2018 | Nam et al. |
| 2018/0277929 A1 | 9/2018 | Seo et al. |
| 2018/0277934 A1 | 9/2018 | Kim et al. |
| 2018/0278731 A1 | 9/2018 | Lee et al. |
| 2018/0288203 A1 | 10/2018 | Jeon et al. |
| 2018/0331418 A1* | 11/2018 | Kim ..................... H01Q 9/0414 |
| 2019/0052292 A1* | 2/2019 | Seo ..................... H01Q 9/0421 |
| 2019/0067821 A1 | 2/2019 | Kim et al. |

\* cited by examiner

WIDE-BAND ANTENNA AND ELECTRONIC DEVICE INCLUDING THE SAME

CROSS-REFERENCE TO RELATED APPLICATION(S)

This application is based on and claims priority under 35 U.S.C. § 119 to Korean Patent Application No. 10-2019-0052637, filed on May 3, 2019, in the Korean Intellectual Property Office, the disclosure of which is incorporated by reference herein in its entirety.

BACKGROUND

1. Field

The present disclosure relates generally to a wide-band antenna structure and an electronic device including a wide-band antenna.

2. Description of Related Art

Full displays have been increasingly used as displays mounted on electronic devices, and considering the application of full displays, there is a trend to minimize a black matrix (BM) area.

In addition, an electronic device includes a plurality of antennas so as to support frequencies in various bands for supporting various wireless communication functions.

When a screen is enlarged to a full display by electronic devices, a sufficient separation distance may not be ensured between an antenna device and an internal electrical object, such as a display module. Thus, it may be difficult to ensure sufficient radiation performance of the antenna device.

In practice, the electronic device has a very narrow antenna mounting space due to the reduction in the BM area. Due to this structure, it may be difficult to maintain adequate radiation performance of the antenna device.

SUMMARY

The present disclosure has been made to address the above-mentioned problems and disadvantages, and to provide at least the advantages described below.

According to an aspect of the present disclosure, an electronic device includes a housing including a first plate disposed to be oriented in a first direction, a second plate disposed to be oriented in a second direction opposite the first direction, and a side member surrounding a space between the first plate and the second plate and coupled to or integrally formed with the second plate; a display visible through at least part of the first plate; a printed circuit board (PCB) disposed in the space and including a ground; a first conductive pattern disposed between the PCB and the second plate and including a first portion and a second portion spaced apart from the first portion; a radio frequency (RF) communication circuit electrically connected with the first portion and configured to transmit or receive at least one signal having a predetermined frequency; a first conductive path electrically connecting the first portion and the RF communication circuit; a second conductive path electrically connecting the second portion and a first position of the ground; a third conductive path electrically connecting the first portion and a second position of the ground; and a fourth conductive path electrically connecting the first portion and a third position of the ground.

According to another aspect of the present disclosure, an electronic device includes a PCB including a ground and an RF communication circuit; a rear case disposed to face the PCB; and an antenna device disposed on the PCB and the rear case. The antenna device may include a first antenna corresponding to intermediate and high bands, and a second antenna corresponding to a low band, the second antenna being spaced apart from the first antenna. The first antenna includes a first antenna radiation pattern including a first portion and a second portion spaced apart from the first portion, and disposed on one surface of the rear case; a first conductive connection member disposed between the first portion and the PCB; a second conductive connection member disposed between the second portion and the PCB; a first power-feeding line that electrically connects the RF communication circuit and the first conductive connection member so as to feed power; a first ground line electrically connecting the second conductive connection member and the ground so as to ground the first antenna radiation pattern; a second ground line electrically connecting the second conductive connection member and the ground so as to ground the first antenna radiation pattern; and a third ground line electrically connecting the first conductive connection member and the ground so as to ground the first antenna radiation pattern. The second antenna includes a second antenna radiation pattern including a third portion and a fourth portion spaced apart from the third portion, and disposed on the one surface of the rear case; a third conductive connection member disposed between the third portion and the PCB; a fourth conductive connection member disposed between the fourth portion and the PCB; a second power-feeding line electrically connecting the third conductive connection member and the RF communication circuit so as to feed power to the second antenna radiation pattern; a fourth ground line electrically connecting the fourth conductive connection member and the PCB so as to ground the second antenna radiation pattern; and a fifth ground line electrically connecting the third conductive connection member and the PCB so as to ground the second antenna radiation pattern.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
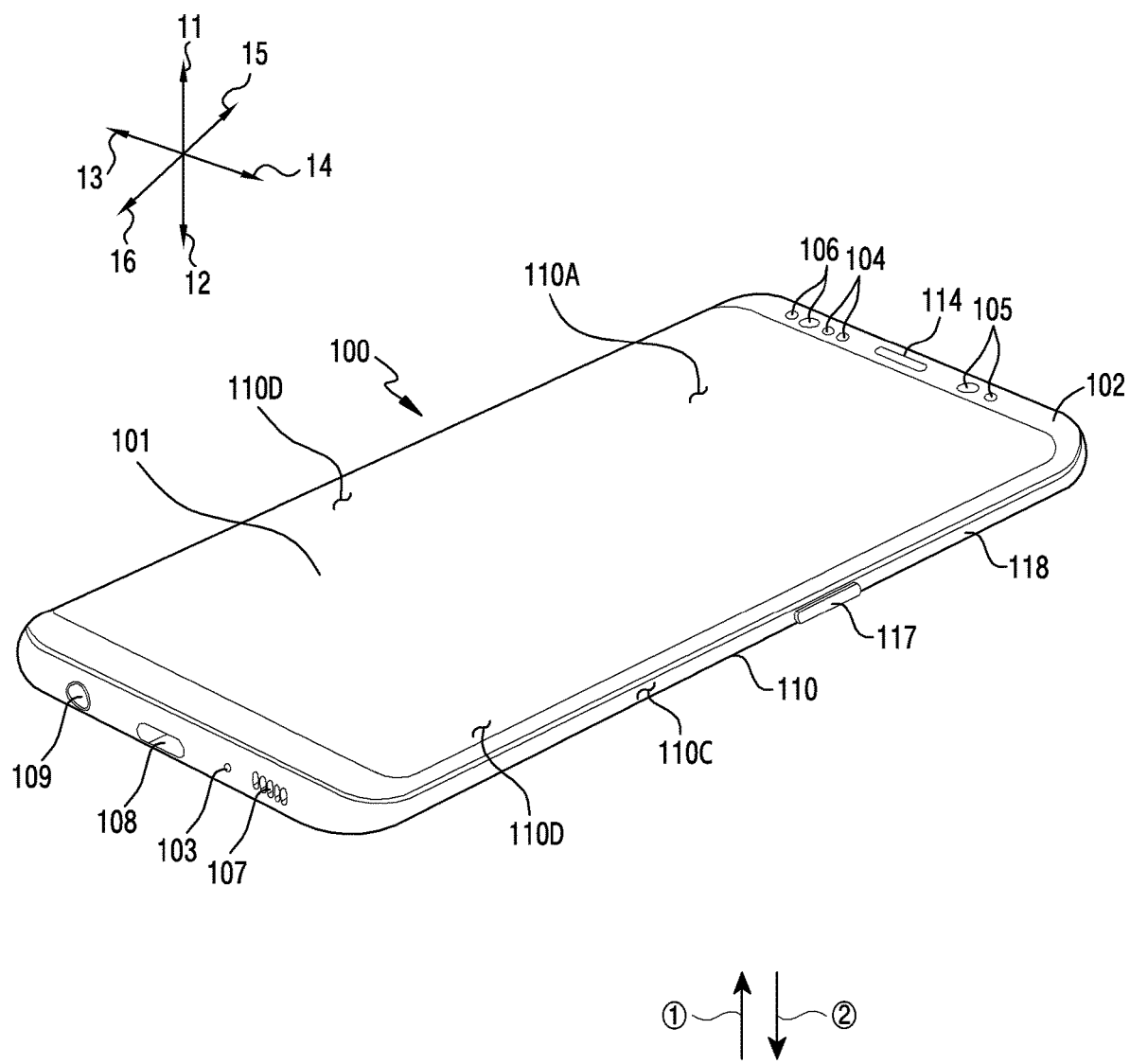
FIG. 1 is a perspective view illustrating the front side of a mobile electronic device, according to an embodiment.

Various embodiments of the present disclosure are described with reference to the accompanying drawings. However, various embodiments of the present disclosure are not limited to particular embodiments, and it should be understood that modifications, equivalents, and/or alternatives of the embodiments described herein can be variously made. With regard to description of drawings, similar components may be marked by similar reference numerals.

According to various embodiments, an electronic device includes an antenna device capable of preventing radiation performance from being reduced by a conductive constituent element disposed close thereto.

According to various embodiments, in an electronic device, it is possible to ensure the performance of an antenna installed in a narrow space close to an electronic component including a conductive constituent element such as a display, a speaker, an earphone jack, a microphone, or a universal serial bus (USB).

An electronic device according to various embodiments of the disclosure may include at least one of, for example, a smart phone, a tablet personal computer (PC), a mobile phone, a video phone, an electronic book reader (e-book reader), a desktop PC, a laptop PC, a netbook computer, a workstation, a server, a personal digital assistant (PDA), a portable multimedia player (PMP), a Moving Picture Experts Group (MPEG)-1 audio layer-3 (MP3) player, a mobile medical device, a camera, and a wearable device (e.g., smart glasses or a head-mounted device (HMD), electronic clothing, an electronic bracelet, an electronic necklace, an electronic accessory (appcessory), an electronic tattoo, a smart mirror, or a smart watch).

Figure 2:
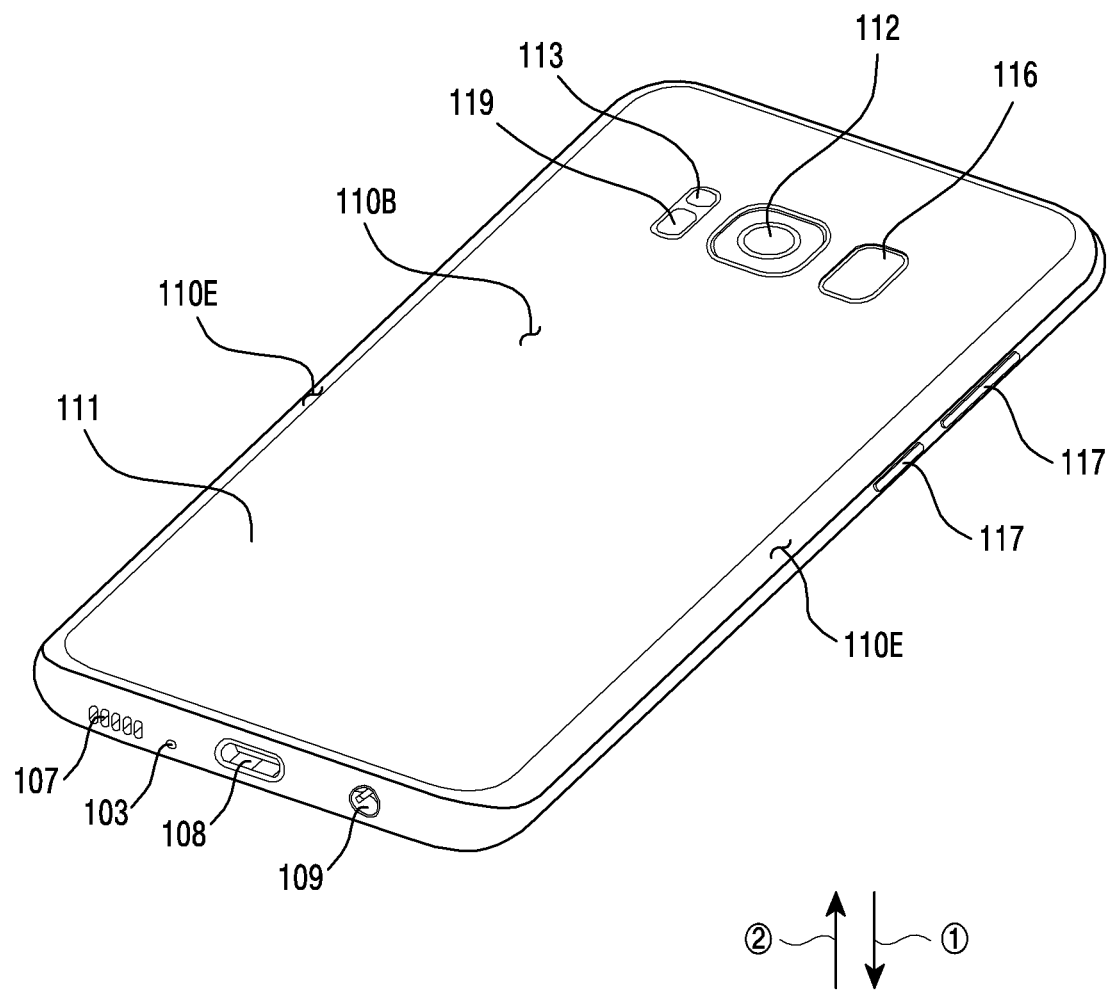
FIG. 2 is a perspective view illustrating the rear side of the electronic device of FIG. 1, according to an embodiment.

FIG. 1 is a perspective view illustrating the front face of a mobile electronic device, according to an embodiment. FIG. 2 is a perspective view illustrating the rear face of the electronic device of FIG. 1, according to an embodiment.

Referring to FIGS. 1-2, an electronic device 100 includes a housing 110 including a first face (or a front face) 110A, a second face (or a rear face) 110B, and a side face 110C surrounding a space between the first face 110A and the second face 110B. The term "housing" may refer to a structure forming some of the first face 110A, the second face 110B, and the side face 110C of FIG. 1. At least a portion of the first face 110A may be formed by a substantially transparent front plate 102 (e.g., a glass plate or a polymer plate including various coating layers). The second face 110B may be formed of a substantially opaque rear plate 111. The rear plate 111 may be formed of, for example, coated or colored glass, ceramic, a polymer, or a metal (e.g., aluminum, stainless steel (STS), or magnesium), or a combination of two or more of these materials. The side faces 110C may be formed by a side bezel structure (or a "side member") 118 coupled to the front plate 102 and the rear plate 111 and including a metal and/or a polymer. The rear plate 111 and the side bezel structure 118 may be integrally formed, and may include the same material (e.g., a metal material such as aluminum).

The front plate 102 may include two first areas 110D, which are bent from the first face 110A toward the rear plate 111 and extend seamlessly, at the long opposite side edges thereof. In FIG. 2, the rear plate 111 includes two second areas 110E, which are bent from the second face 110B toward the front plate 102 and extend seamlessly, at the long opposite side edges thereof. The front plate 102 (or the rear plate 111) may include only one of the first areas 110D (or one of the second areas 110E). Some of the first areas 110D and the second areas 110E may not be included. When viewed from a side of the electronic device 100, the side bezel structure 118 may have a first thickness (or width) on the side faces, which do not include the first areas 110D or the second areas 110E, and may have a second thickness (or width), which is thinner than the first thickness, on the side faces which include the first areas 110D or the second areas 110E.

The electronic device 100 may include at least one of a display 101, a microphone hole 103, a first speaker hole 107, and a second speaker hole 114, a first sensor module 104, a second sensor module 116 (e.g., a fingerprint sensor), and a third sensor module 119, a first camera module 105, a second camera module 112, and a third camera module 113 (e.g., a flash), a key input device 117, light-emitting elements 106, a first connector hole 108 and a second connector hole 109. In the electronic device 100, at least one of the components ((e.g., the key input device 117 or the light-emitting element 106) may be omitted, or other components may be additionally included.

The display 101 may be exposed through, for example, a large portion of the front plate 102. At least a part of the display 101 may be exposed through the front plate 102 forming the first face 110A and the first areas 110D of the side faces 110C. The edges of the display 101 may be formed to be substantially the same as the contour shape of the front plate 102 adjacent thereto. The distance between the outer contour of the display 101 and the outer contour of the front plate 102 may be substantially constant in order to enlarge the exposed area of the display 101.

A recess or an opening may be formed in a part of a screen display area of the display 101, and at least one of a second speaker hole 114, a first sensor module 104, a first camera module 105, and light-emitting elements 106 may be aligned with the recess or the opening. At least one of the second speaker hole 114, the first sensor module 104, the first camera module 105, the second sensor module 116 (e.g., a fingerprint sensor), and the light-emitting elements 106 may be included in the rear face of the screen display area of the display 101. The display 101 may be coupled to or disposed adjacent to a touch-sensing circuit, a pressure sensor capable of measuring the intensity of the touch (pressure), and/or a digitizer that detects a stylus pen. At least one or more of the first sensor module 104, the third sensor module 119 and/or the key input device 117 may be disposed in the first areas 110D and/or the second areas 110E.

The microphone hole 103 may include a microphone disposed therein so as to acquire external sound, and multiple microphones may be disposed therein so as to detect the direction of sound. The first speaker hole 107 and the second speaker hole 114 may respectively include an external speaker hole and a phone call receiver hole. The first speaker hole 107, the second speaker hole 114, and the microphone hole 103 may be implemented as a single hole, or a speaker may be included without the first speaker hole 107 and the second speaker hole 114 (e.g., a piezo speaker).

The first sensor module 104, the second sensor module 116, and the third sensor module 119 may generate electrical signals or data values corresponding to an internal operating state or an external environmental condition of the electronic device 100. The first sensor module 104, the second sensor module 116, and the third sensor module 119 may include, for example, a first sensor module 104 (e.g., a proximity sensor) and/or a second sensor module (e.g., a fingerprint sensor) disposed on the first face 110A of the housing 110, and/or a third sensor module 119 (e.g., a heart rate monitor (HRM) sensor) and/or a fourth sensor module disposed on the second face 110B of the housing 110. The fingerprint sensor may be disposed not only on the first face 110A of the housing 110, but also on the second face 110B. The electronic device 100 may further include at least a gesture sensor, a gyro sensor, an air pressure sensor, a magnetic sensor, an acceleration sensor, a grip sensor, a color sensor, an infrared (IR) sensor, a biosensor, a temperature sensor, a humidity sensor, and an illuminance sensor.

The first camera module 105, the second camera module 112, and the third camera module 113 may respectively include a first camera device disposed on the first face 110A of the electronic device 100 and a second camera device disposed on the second face 110B, and/or a flash. The first camera module 105 and the second camera module 112 may include one or more lenses, an image sensor, and/or an image signal processor (ISP). The flash may include, for example, a light-emitting diode or a xenon lamp. Two or more lenses (e.g., an IR camera lens, a wide-angle lens, and a telephoto lens) and image sensors may be disposed on one face of the electronic device 100.

The key input device 117 may be disposed on the side face 110C of the housing 110. The electronic device 100 mayor may not include the key input device 117. Additionally, the key input device may be implemented in another form such as a soft key on the display 101. The key input device 117 may include a sensor module 116 disposed on the second face 110B of the housing 110.

The light-emitting elements 106 may be disposed, for example, on the first face 110A of the housing 110. The light-emitting elements 106 may provide, for example, the status information of the electronic device 100 in an optical form. The light-emitting element 106 may provide a light source that is interlocked with, for example, the operation of the first camera module 105. The light-emitting elements 106 may include, for example, a light emitting diode (LED), an IR LED, and a xenon lamp.

The first connector hole 108 may be capable of accommodating a connector (e.g., a USB connector) for transmitting and receiving power and/or data to and from an external electronic device, and/or a second connector hole 109 capable of receiving a connector (e.g., an earphone jack) for transmitting and receiving an audio signal to and from an external electronic device.

Figure 3:
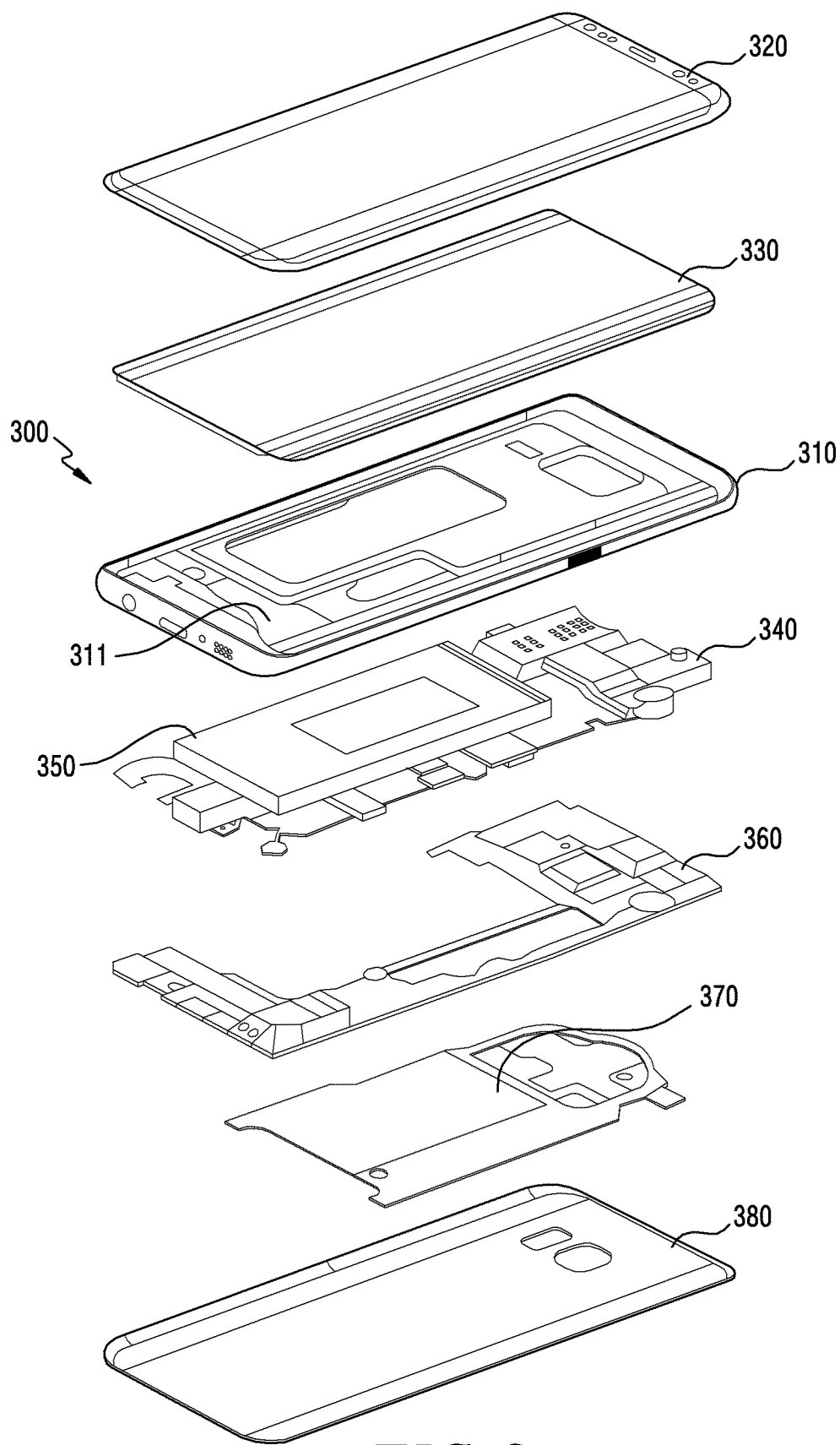
FIG. 3 is an exploded perspective view illustrating the internal configuration of the electronic device of FIG. 1, according to an embodiment.

FIG. 3 is an exploded perspective view illustrating the internal configuration of the electronic device of FIG. 1, according to an embodiment.

Referring to FIG. 3, an electronic device 300 includes a side bezel structure 310, a first support member 311 (e.g., a bracket), a front plate 320, a display 330, a PCB 340, a battery 350, a second support member 360 (e.g., a rear case), an antenna 370, and a rear plate 380. At least one of the components (e.g., the first support member 311 or the second support member 360) may be omitted from the electronic device 300, or the electronic device 300 may additionally include other components. At least one of the components of the electronic device 300 may be the same as or similar to at least one of the components of the electronic device 100 of FIG. 1 or 2, and a redundant description thereof is omitted below.

The first support member 311 may be disposed inside the electronic device 300 and connected to the side bezel structure 310 or may be formed integrally with the side bezel structure 310. The first support member 311 may be formed of, for example, a metal material and/or a non-metal (e.g., polymer) material. The display 330 may be coupled to one face of the first support member 311, and the PCB 340 may be coupled to the other face of the first support member 332. On the PCB 340, a processor, a memory, and/or an interface may be mounted. The processor may include at least one of, for example, a central processing unit (CPU), an application processor (AP), a graphic processor unit (GPU), an ISP, a sensor hub processor, or a communication processor (CP).

The memory may include, for example, a volatile memory or a nonvolatile memory.

The interface may include, for example, a high definition multimedia interface (HDMI), a USB interface, a secure digital (SD) card interface, and/or an audio interface. The interface may electrically or physically connect, for example, the electronic device 300 to an external electronic device, and may include a USB connector, an SD card connector, a multimedia card (MMC) connector, or an audio connector.

The battery 350 may be a device for supplying power to at least one component of the electronic device 300, and may include, for example, a non-rechargeable primary battery, a rechargeable secondary battery, or a fuel cell. At least a part of the battery 350 may be disposed to be substantially flush with, for example, the PCB 340. The battery 350 may be integrally disposed within the electronic device 300, or may be mounted to be detachable from the electronic device 300.

The antenna 370 may be disposed between the rear plate 380 and the display 350. The antenna 370 may include, for example, a near-field communication (NFC) antenna, a wireless charging antenna, and/or a magnetic secure transmission (MST) antenna. The antenna 370 may perform short-range communication with, for example, an external device, or may transmit/receive power required for charging in a wireless manner to/from the external device. An antenna structure may be formed by the side bezel structure 310, a part of the first support member 311, or a combination thereof.

Figure 4:
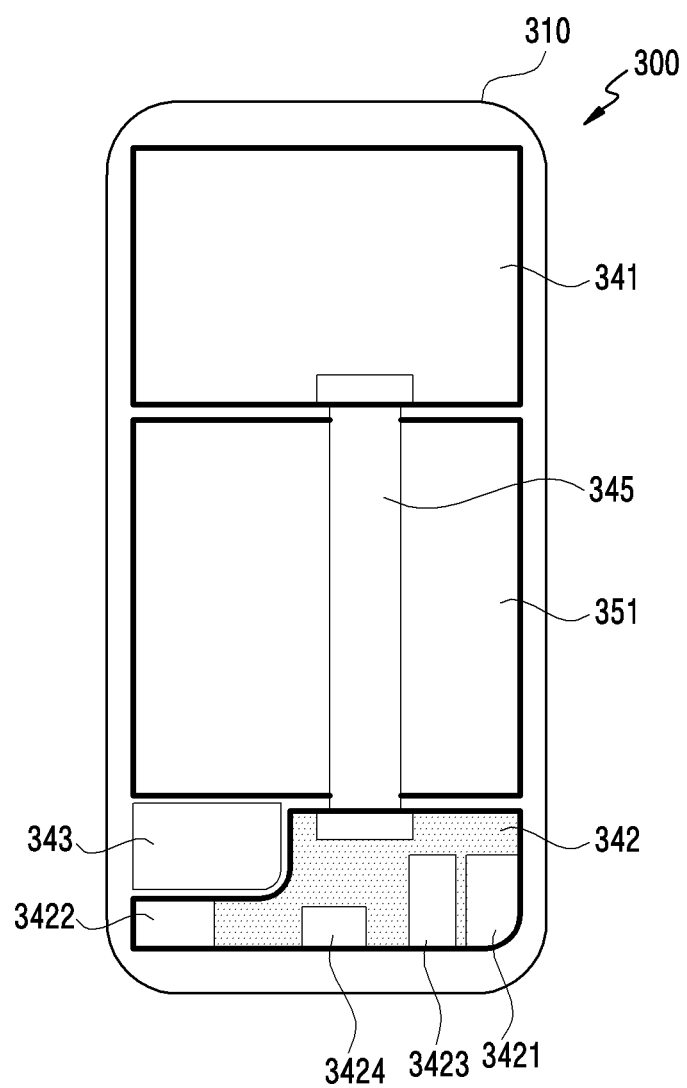
FIG. 4 is a plan view schematically illustrating a disposed state of circuit boards disposed inside a housing of an electronic device, according to an embodiment.

FIG. 4 is a plan view schematically illustrating a disposed state of circuit boards disposed inside a housing of an electronic device, according to an embodiment.

Referring to FIG. 4, an electronic device 300 includes a housing 310, a first PCB 341, a second PCB 342, a battery 351, and a speaker module 343. The first PCB 341 may be a main printed circuit board (main PCB) and the second PCB 342 may be a sub-PCB. The battery 351 may be disposed between the first PCB 341 and the second PCB 342. A connector 345 may be disposed to electrically connect the second PCB 342 and the first PCB 341. For example, the connector 345 may include a cable bundle or a flexible PCB. The speaker module 343 may be disposed not to substantially overlap the battery 351 and the second PCB 342, but to be parallel with the battery 351 and the second PCB 342.

The second PCB 342 may include a first non-grounded region 3421, a second non-grounded region 3422, a third non-grounded region 3423, and a fourth non-grounded region 3424. For example, a USB connector may be disposed in the fourth non-grounded region 3424, and an ear jack connection device may be disposed in the third non-grounded area 3423.

Figure 5:
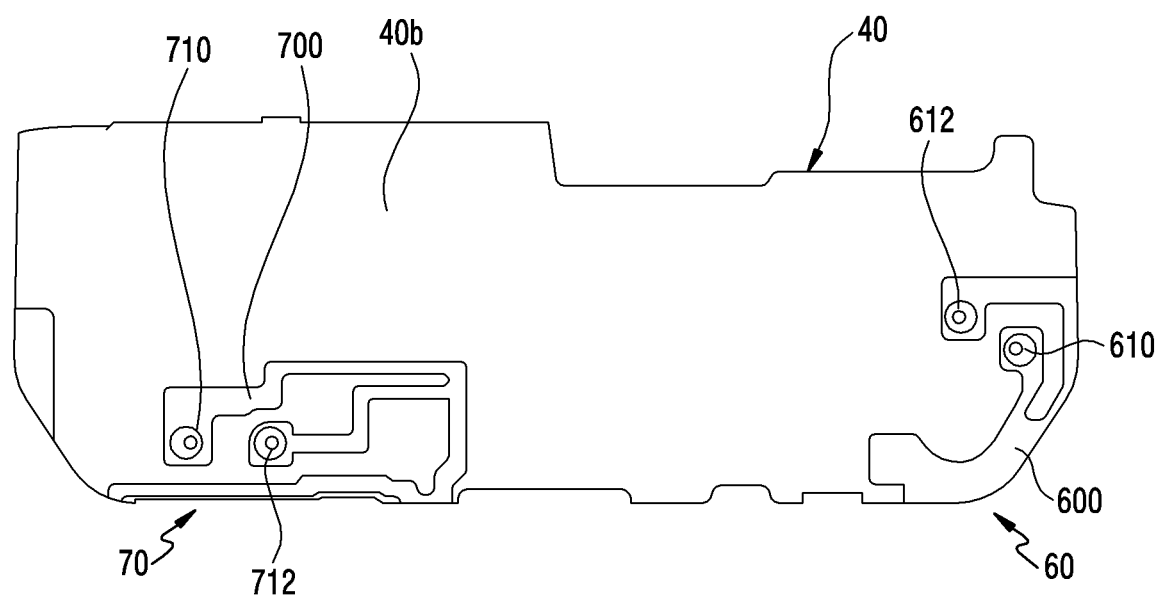
FIG. 5 is a plan view illustrating conductive patterns disposed on an insulative member of a housing, according to an embodiment.
Figure 6:
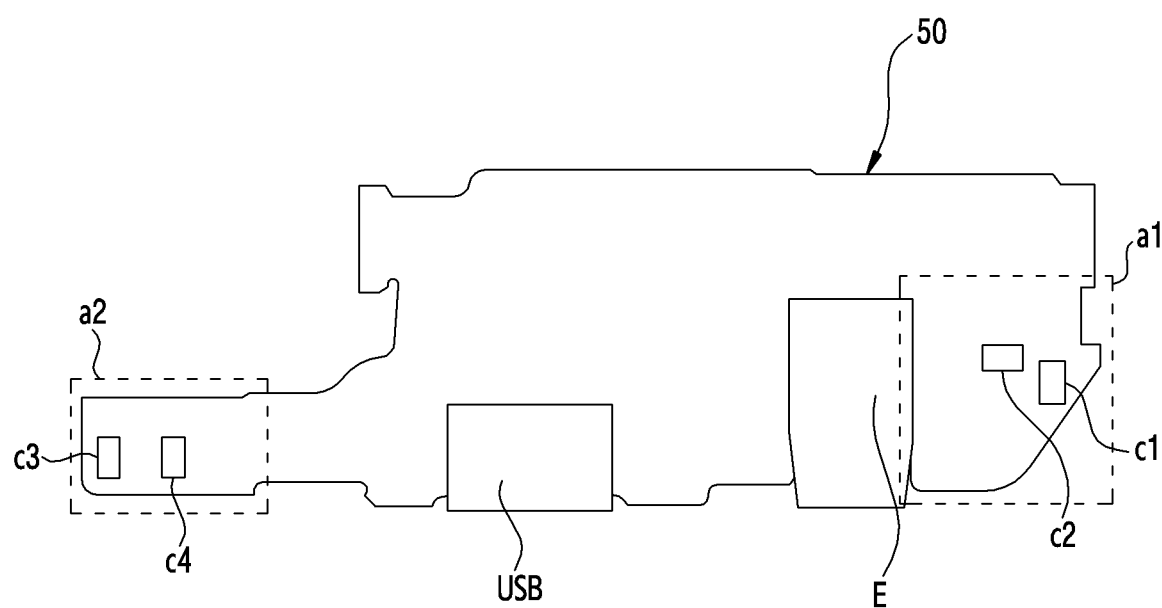
FIG. 6 is a plan view illustrating a sub-printed circuit board (sub-PCB) disposed inside the housing, according to an embodiment.
Figure 7:
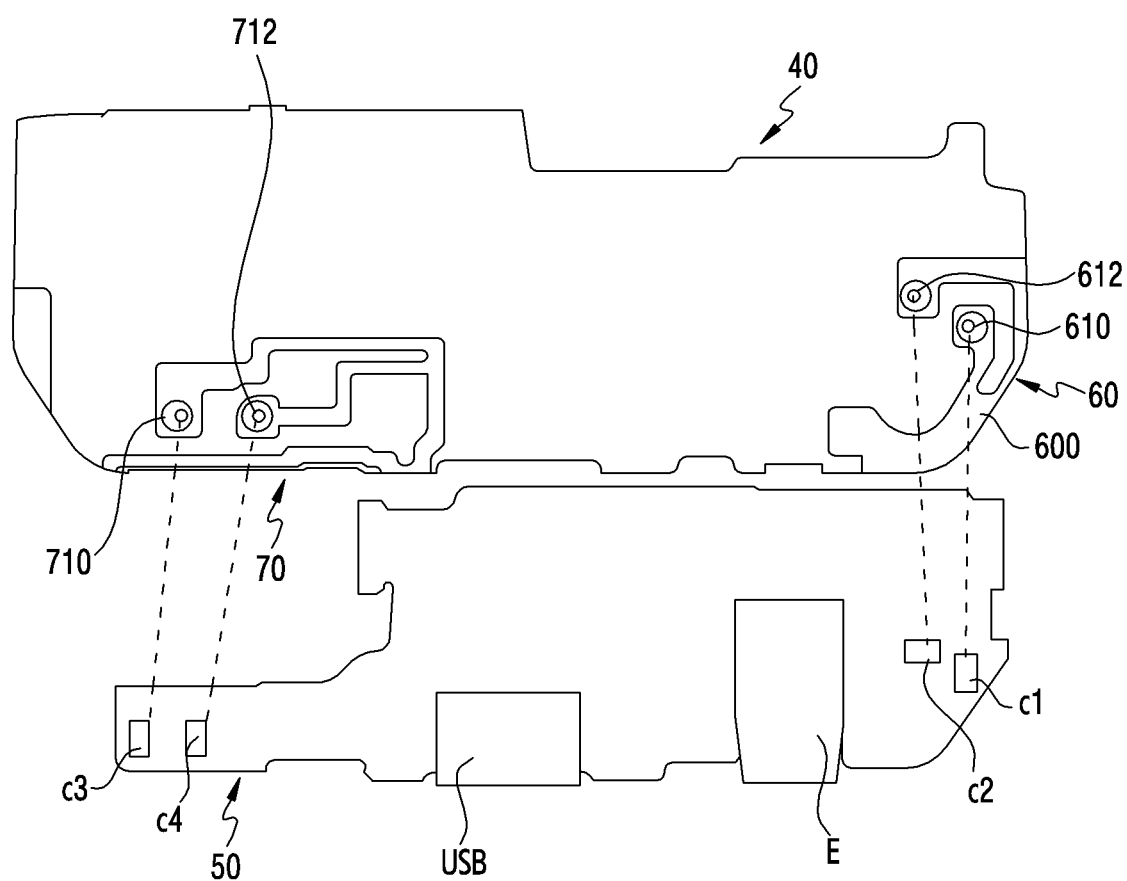
FIG. 7 is a view illustrating the disposed state of antenna devices, according to an embodiment.

FIG. 5 is a plan view illustrating conductive patterns disposed on an insulative member of a housing, according to an embodiment. FIG. 6 is a plan view illustrating a sub-PCB disposed inside the housing, according to an embodiment. FIG. 7 is a view illustrating the disposed state of antenna devices, according to an embodiment.

Referring to FIGS. 5-7, one or more of a first conductive pattern 600 and a second conductive pattern 700 disposed in an electronic device is disposed on an insulative member 40. The electronic device may include antenna devices disposed on an insulative member 40 and a sub-PCB 50. An antenna device may include a first antenna 60 for a first band and/or a second antenna 70 for a second band spaced apart from the first antenna 60. The first antenna 60 may support a medium band and/or a high band, for example, a 1.7 megahertz (MHz) band to a 2 MHz band. The second antenna 70 may support a low band, for example, a band of 1.7 MHz or less. The first antenna 60 may be disposed on one side of a second surface 40b of the insulative member 40, oriented in a second direction (e.g., the second direction Q illustrated in FIG. 1). The second antenna 70 may be disposed on the other side of the second surface 40b. The rear case 360 may include an insulative member 40.

The first antenna 60 may include at least one first conductive pattern 600. The first conductive pattern 600 is an antenna radiator, and may include one or more portions. For example, the first conductive pattern 600 may include a first portion 610 and a second portion 612 spaced apart from the first portion 610. The first conductive pattern 600 may be formed on the insulative member 40 using a metallic material layer or a thin metal plate. The first portion 610 may be electrically connected to a sub-PCB 50 by a first conductive connection member c1. Additionally or alternatively, the second portion 612 may be electrically connected to the sub-PCB 50 by a second conductive connection member c2. The first conductive connection member c1 or the second conductive connection member c2 may be omitted.

The second antenna 70 may include at least one second conductive pattern 700. The second conductive pattern 700 may be an antenna radiator, and may include one or more portions. For example, the second conductive pattern 700 may include a first portion 710 and a second portion 712 spaced apart from the first portion 710. The second conductive pattern 700 may be formed on the insulative member 40 using a metallic material layer or a thin metal plate. The first portion 710 may be electrically connected to the sub-PCB 50 by a third conductive connection member c3. The second portion 712 may be electrically connected to the sub-PCB 50 by a fourth conductive connection member c4. The third conductive connection member c3 or the fourth conductive connection member c4 may be omitted.

The first antenna 60 may be disposed close to a first component including a conductive element, such as an earphone jack connection device E. The first conductive pattern 600 may be disposed close to the earphone jack connection device E. The earphone jack connection device E may include an earphone jack housing and a plurality of connection terminals. The second antenna 70 may be disposed close to a second component, such as a USB connector. For example, the first component or the second component may include a speaker, an earphone jack connection device, a USB connector, a camera, or a sensor.

When viewed from above the second surface 40b, at least a portion of a first region a1 of the sub-PCB 50 may overlap the first conductive pattern 600. When viewed from above the second surface 40b, at least a portion of a second region a2 of the sub-PCB 50 may overlap the second conductive pattern 700.

Figure 8A:
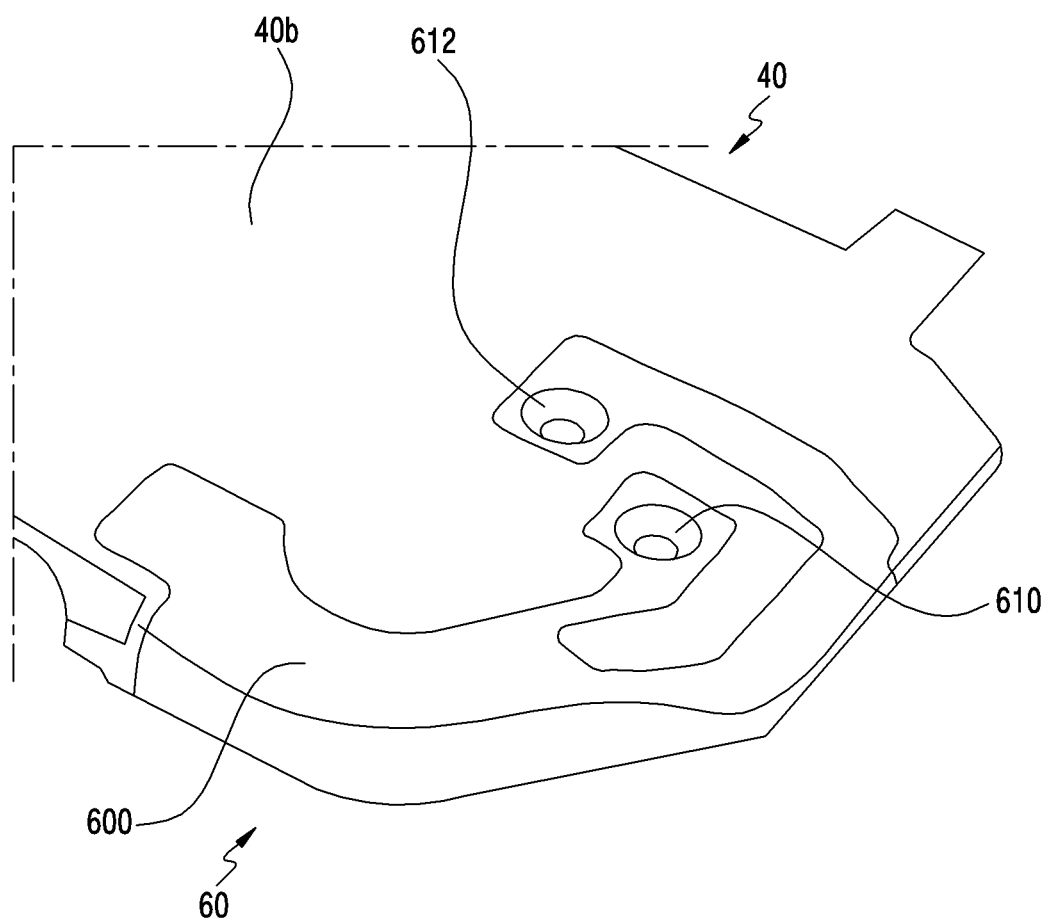
FIG. 8A is a perspective view illustrating a first conductive pattern of a first antenna disposed on an insulative member, according to an embodiment.
Figure 8B:
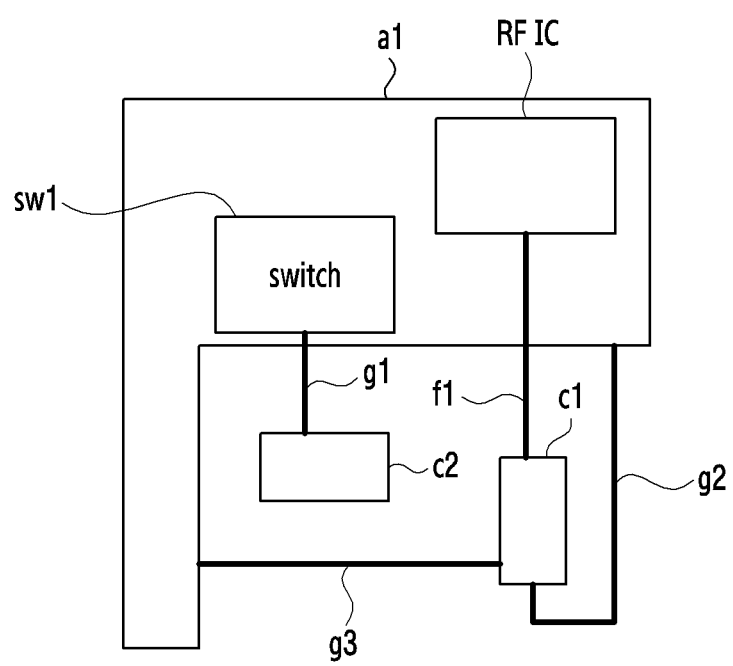
FIG. 8B is a block diagram schematically illustrating a configuration disposed on a sub-PCB, according to an embodiment.
Figure 9:
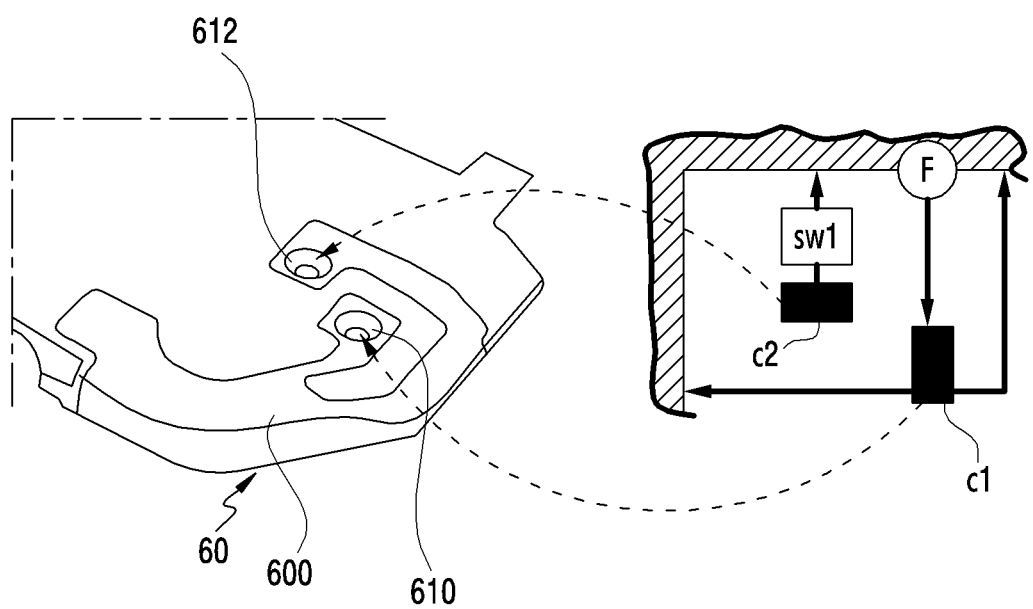
FIG. 9 is a view illustrating a disposed state of a first antenna, according to an embodiment.

FIG. 8A is a perspective view illustrating the first conductive pattern of the first antenna disposed on the insulative member, according to an embodiment. FIG. 8B is a block diagram schematically illustrating a configuration disposed on the sub-PCB, according to an embodiment. FIG. 9 is a view illustrating the disposed state of the first antenna, according to an embodiment.

Referring to FIGS. 8A, 8B, and 9, the first antenna 60 is an antenna capable of supporting medium and high bands in a 1700 MHz to 2700 MHz band, and may include a first conductive pattern 600, a first conductive connection member c1 or a second conductive connection member c2, or first to fourth conductive paths. The first conductive path f1 may include a first power-feeding line, the second conductive path g1 may include a first ground line, the third conductive path g2 may include a second ground line, and the fourth conductive path g3 may include a third ground line.

The first conductive pattern 600 may be provided on one face of the insulative member 40, such as a second surface 40b oriented in the second direction. Additionally or alternatively, the first conductive pattern 600 may be formed inside the insulative member 40. The first conductive pattern 600 may be provided on a side corner portion of the insulative member 40. The first portion 610 may be electrically connected to the sub-PCB 50 by the first conductive connection member c1. The second portion 612 may be electrically connected to the sub-PCB 50 by the second conductive connection member c2. The first conductive connection member c1 or the second conductive connection member c2 may include a C-clip. Additionally or alternatively, the first conductive connection member c1 or the second conductive connection member c2 may be mounted on the sub-PCB 50 through a surface mount device (SMD).

At least one of the first conductive path f1, the third conductive path g2, or the fourth conductive path g3 may include the first conductive connection member c1.

The first conductive path f1 may electrically connect the first portion 610 and a wireless communication circuit (e.g., an RF IC) so as to allow power to be supplied to the first conductive pattern 600. The first conductive path f1 may perform a power supply function.

The second conductive path g may include the second conductive connection member c2. The second conductive path g1 may electrically connect the second portion 612 to a first position of a ground included in the sub-PCB 50.

The third conductive path g2 may electrically connect the first portion 610 to a second position of the ground included in the sub-PCB 50.

The fourth conductive path g3 may electrically connect the first portion 610 to a third position of the ground included in the sub-PCB 50.

Each of the second conductive path g1, the third conductive path g2, and the fourth conductive path g3 may perform a ground line function. The first to third positions in the ground of the sub-PCB 50 may be spaced apart from each other.

A first switch sw1 may be disposed on the second conductive path g1, which electrically connects the second conductive connection member c2 to a ground included in the sub-PCB 50.

Figure 10A:
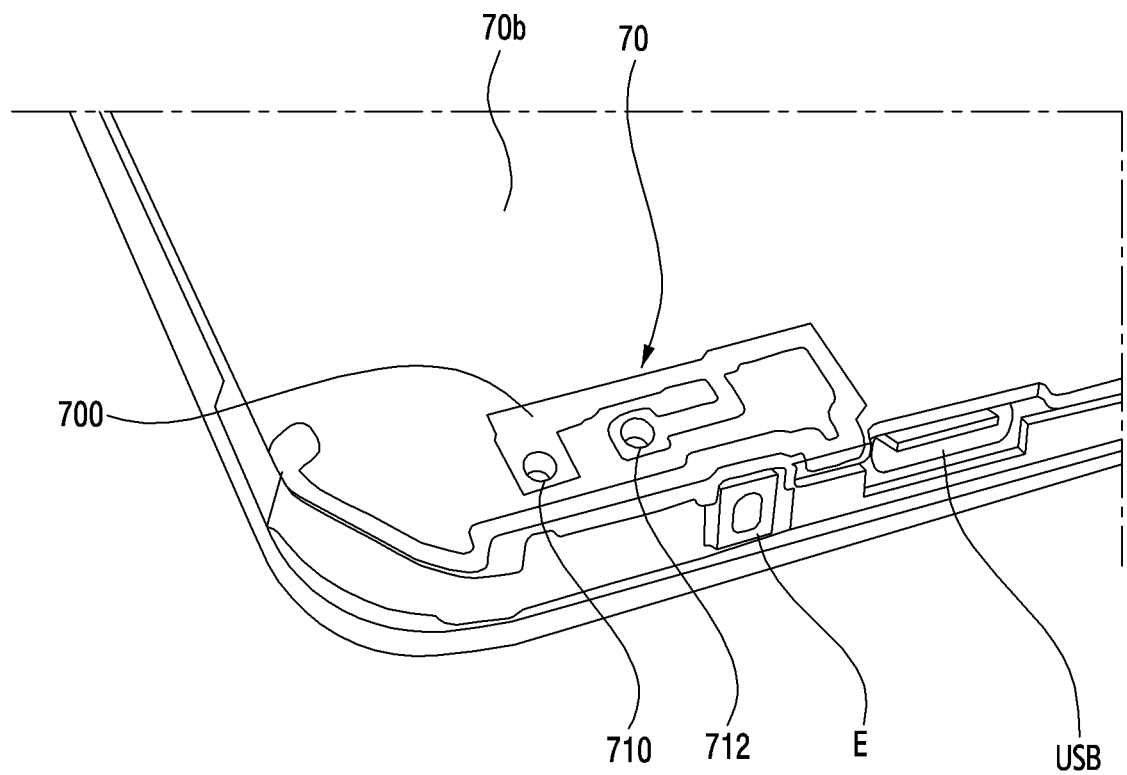
FIG. 10A is a perspective view illustrating the second conductive pattern of a second antenna disposed on the insulative member, according to an embodiment.
Figure 10B:
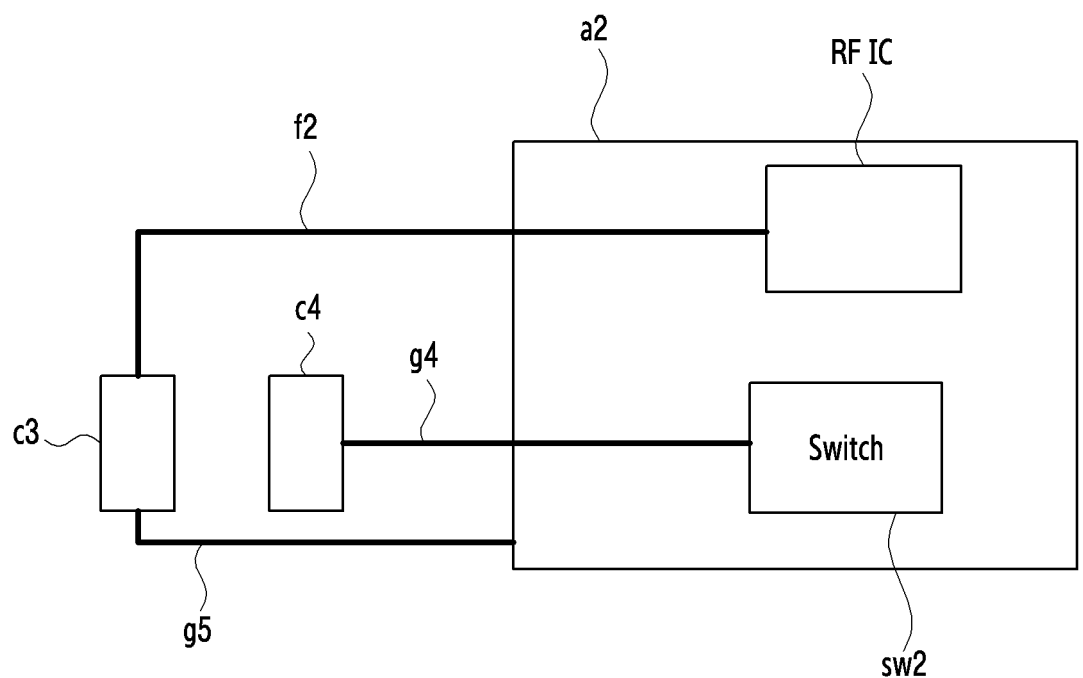
FIG. 10B is a block diagram schematically illustrating a configuration disposed on a sub-PCB, according to an embodiment.
Figure 11:
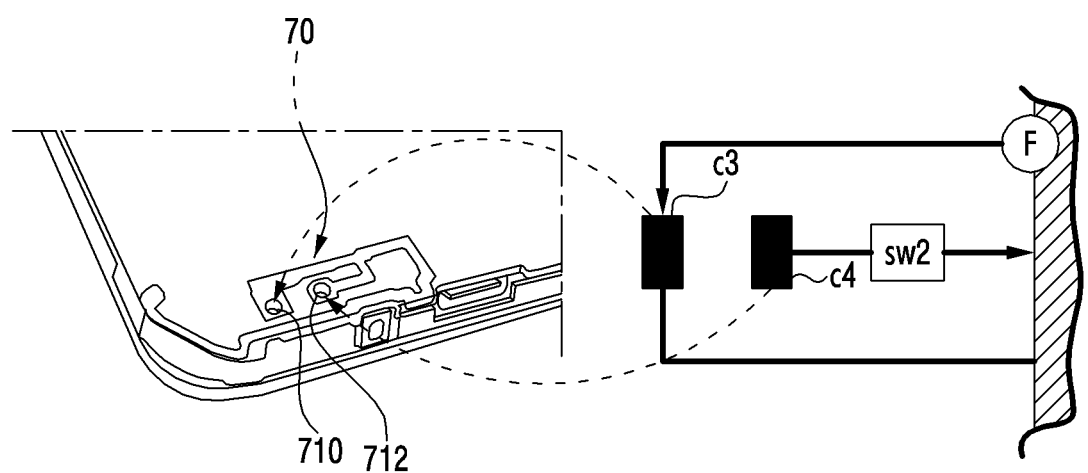
FIG. 11 is a view illustrating the disposed state of a second antenna, according to an embodiment.

FIG. 10A is a perspective view illustrating the second conductive pattern of the second antenna disposed on the insulative member, according to an embodiment. FIG. 10B is a block diagram schematically illustrating a configuration disposed on the sub-PCB, according to an embodiment. FIG. 11 is a view illustrating a disposed state of the second antenna, according to an embodiment.

Referring to FIGS. 10A, 10B, and 11, the second antenna 70 is an antenna capable of supporting a low band of 1700 MHz or lower, and may include a second conductive pattern; a third conductive connection member c3 and a fourth conductive connection member c4; or a fifth conductive path f2, a sixth conductive path g4, and a seventh conductive path g5.

At least one of the fifth conductive path f2 or the seventh conductive path g5 may include the third conductive connection member c3. The fifth conductive path f2 may electrically connect the first portion 710, the second conductive pattern 700, and a wireless communication circuit (e.g., an RF IC) so as to allow power to be supplied to the second conductive pattern 700. The second conductive path f2 may perform a power supply function.

The sixth conductive path g4 may include the fourth conductive connection member c4. The sixth conductive path g4 may electrically connect the second portion 712 of the second conductive pattern 700 to a fourth position of a ground included in the sub-PCB 50. A second switch sw2 may be included on the sixth conductive path g4. The second switch sw2 may be included in the sub-PCB 50.

The seventh conductive path g5 may electrically connect the second portion 712 to a fifth position of the ground included in the sub-PCB 50 so as to ground the second conductive pattern.

Each of the sixth and seventh conductive paths g4 and g5 may perform a ground line function.

Figure 12:
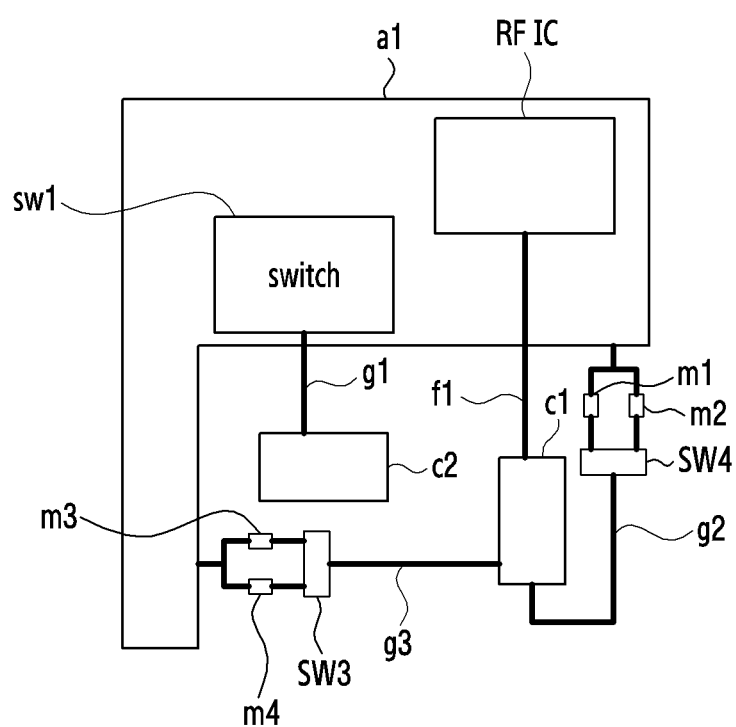
FIG. 12 is a view illustrating a structure in which an antenna further includes switches and/or matching elements, according to an embodiment.

FIG. 12 is a view illustrating a structure in which an antenna includes switches and matching elements, according to an embodiment.

When components in FIG. 12 and components in FIGS. 8A and 8B are denoted by the same reference numeral, the components may be considered as substantially the same components.

Referring to FIG. 12, an electronic device 100 may include at least one of a third switch sw3, a fourth switch sw4, a first matching element m1, a second matching element m2, a third matching element m3, or a fourth matching element m4.

The first antenna 60 may change an operating frequency band based on the operation of the third switch sw3 and the fourth switch sw4. For example, the frequency of the first antenna 60 in the case where the third switch sw3 and the first matching element m1 are connected may be different from that in the case where the third switch sw3 and the second matching element m2 are connected. Additionally or alternatively, the frequency of the first antenna 60 in the case where the fourth switch sw4 and the third matching element m3 are connected may be different from the frequency in the case where the fourth switch sw4 and the fourth matching element m4 are connected.

The first to fourth matching elements m1 to m4 may include at least one capacitor or inductor.

The first antenna may be improved in antenna efficiency according to a ground-switching point in a band between 1700 MHz and 2700 MHz, thereby securing broadband antenna performance.

Figure 13A:
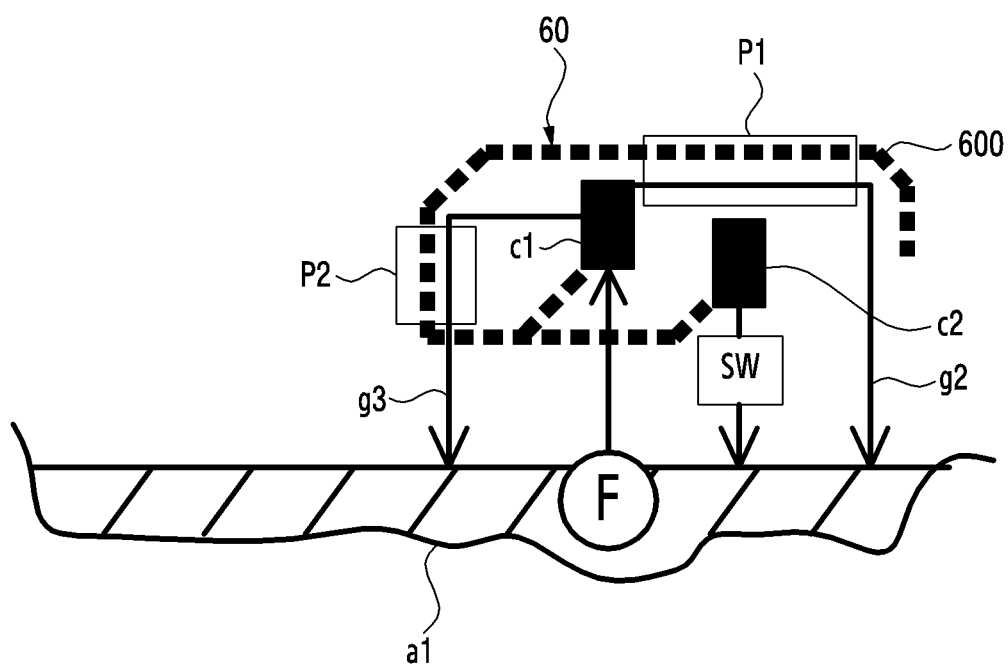
FIG. 13A is a view illustrating the state in which electrical coupling occurs between a conductive path and a conductive pattern in the first antenna, according to an embodiment.

FIG. 13A is a view illustrating the state in which electrical coupling occurs between a conductive path and a conductive pattern in the first antenna, according to an embodiment.

Referring to FIG. 13A, in the first antenna 60, electrical coupling may occur when the conductive path and the conductive pattern are positioned close to each other.

The first conductive pattern 600 may be electrically coupled with at least part of the third conductive path g2 or the fourth conductive path g3. For example, the first conductive pattern 600 may include a first region p1, in which electrical coupling with the third conductive path g2 occurs, and/or a second region p2, in which electrical coupling with the fourth conductive path g3 occurs. At least part of the first conductive pattern 600 (e.g., the first region p1 or the second region p2) may be disposed parallel to at least part of the third conductive path g2 or the fourth conductive path g3.

Figure 13B:
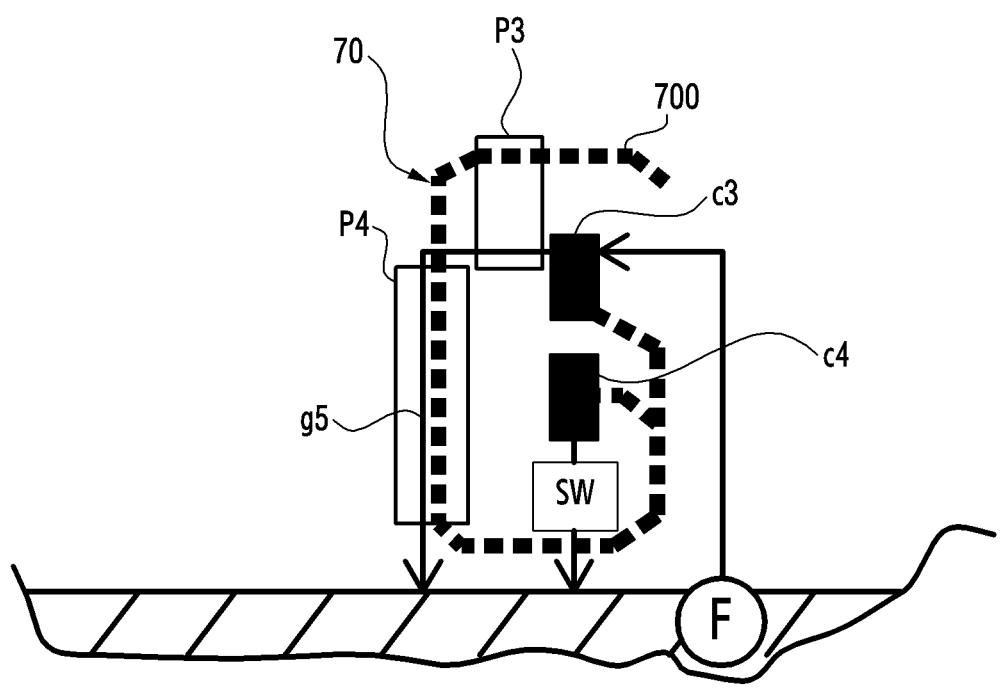
FIG. 13B is a view illustrating the state in which electrical coupling occurs between a conductive path and a conductive pattern in the second antenna, according to an embodiment.

FIG. 13B is a view illustrating the state in which electrical coupling occurs between a conductive path and a conductive pattern in the second antenna, according to an embodiment.

Referring to FIG. 13B, electrical coupling may occur in the first antenna 70 when the conductive path and the conductive pattern are disposed close to each other.

At least part of the seventh conductive path g5 may be electrically coupled to the third region P3 and the fourth region P4 of the second conductive pattern 700. A part of the seventh conductive path g7 may be disposed parallel to the third region P3 and the fourth region P4 of the second conductive pattern 700.

Figure 14:
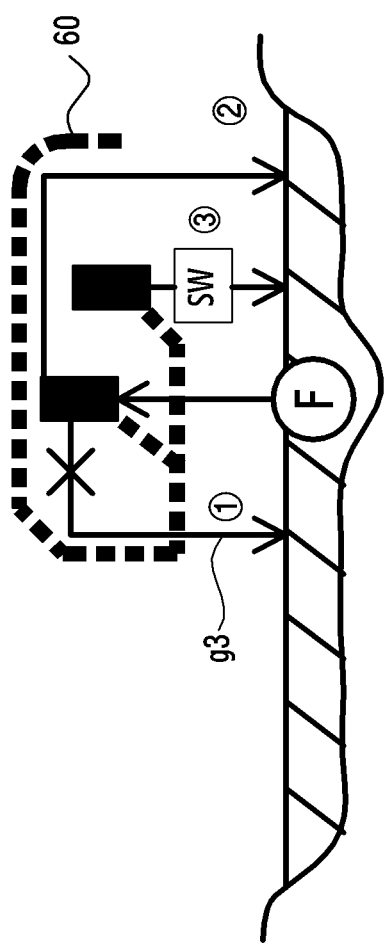
FIG. 14 is a graph representing antenna performance in the case where a fourth conductive path does not exist in the first antenna and antenna performance in the case where a fourth conductive path is added to the first antenna, according to an embodiment.
Figure 14:
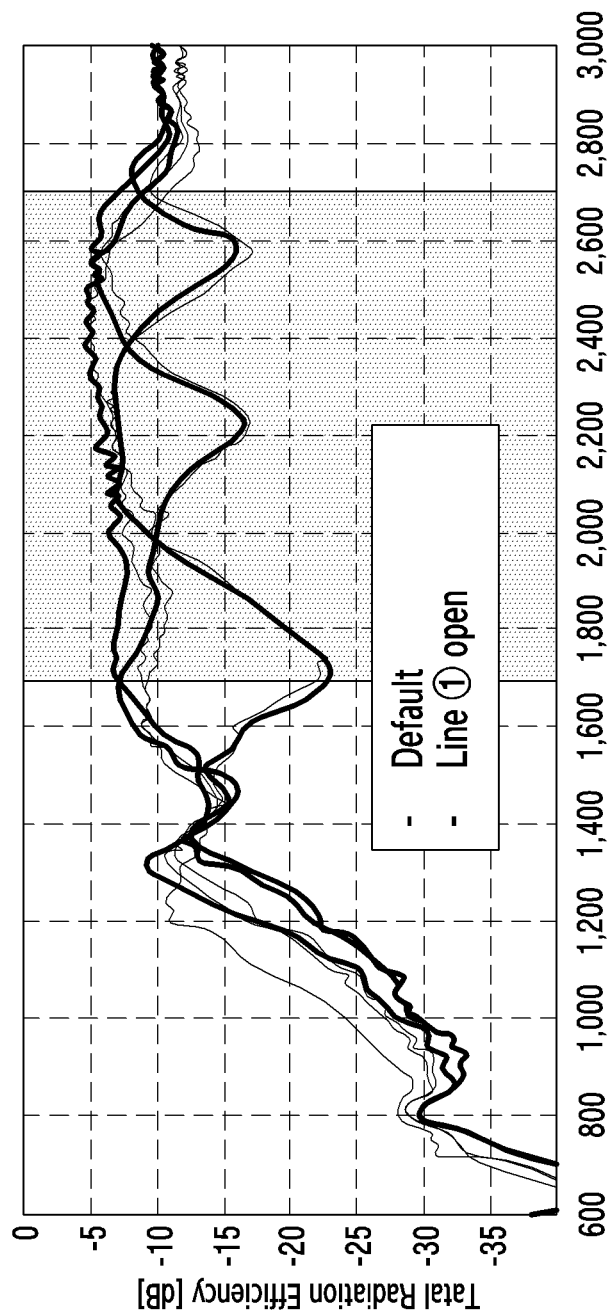

FIG. 14 is a graph representing antenna performance in the case where the fourth conductive path g3 does not exist in the first antenna 60 and antenna performance in the case where the fourth conductive path g3 is added to the first antenna 60. Referring to FIG. 14, it can be seen that in a band between the 1700 MHz and 2700 MHz, the performance of the first antenna 60 is good when the fourth conductive path g3 is added.

Figure 15:
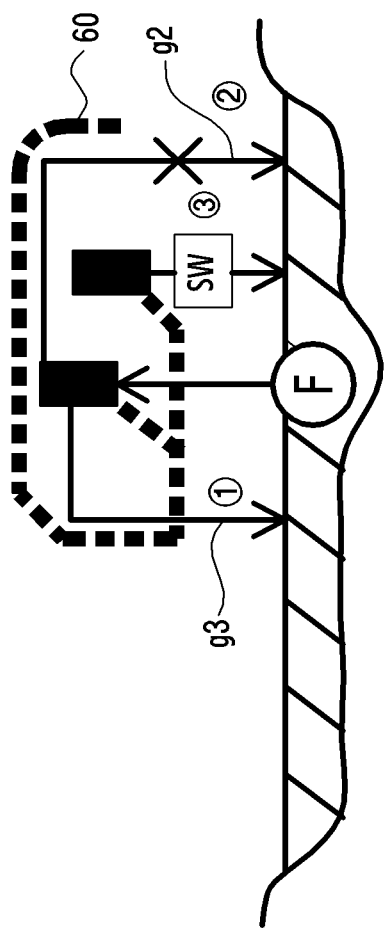
FIG. 15 is a graph representing antenna performance in the case where a third conductive path does not exist in the first antenna and antenna performance in the case where the third conductive path is added to the first antenna, according to an embodiment.
Figure 15:
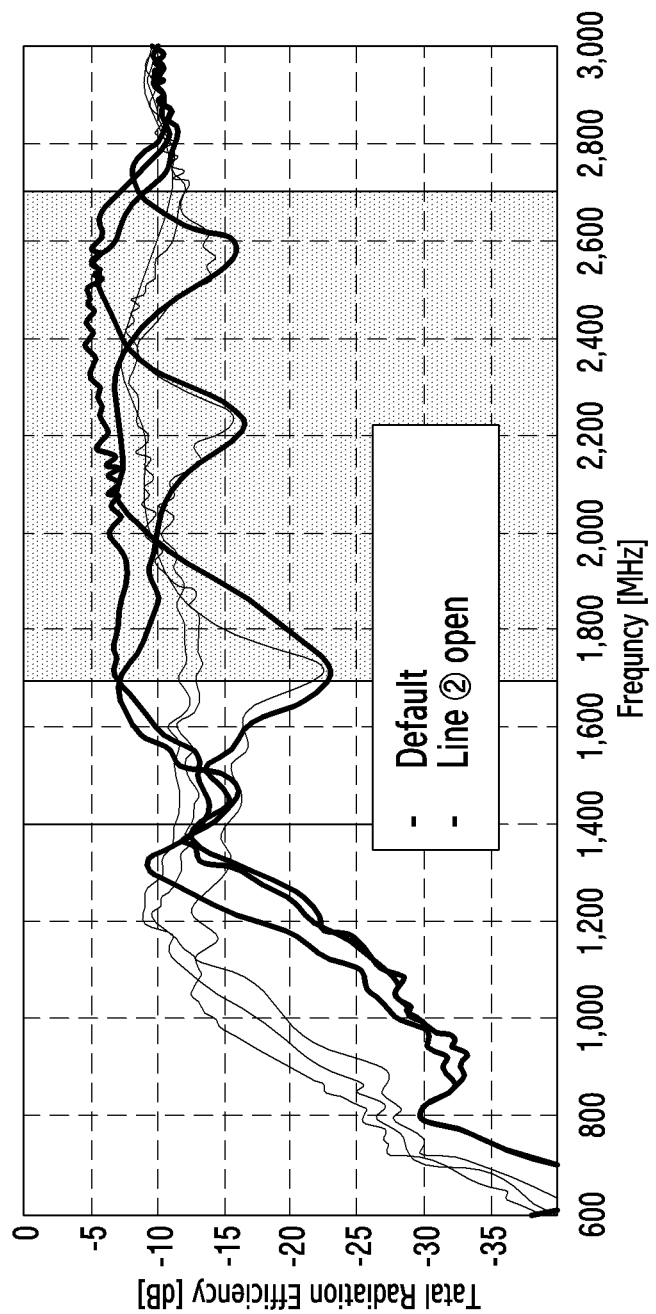

FIG. 15 is a graph representing antenna performance in the case where the third conductive path g2 does not exist in the first antenna 60 and antenna performance in the case where the third conductive path g2 is added to the first antenna 60. Referring to FIG. 15, it can be seen that in a band between 1700 MHz and 2700 MHz, the performance of the first antenna 60 is good when the third conductive path g2 is added to the first antenna 60.

Figure 16:
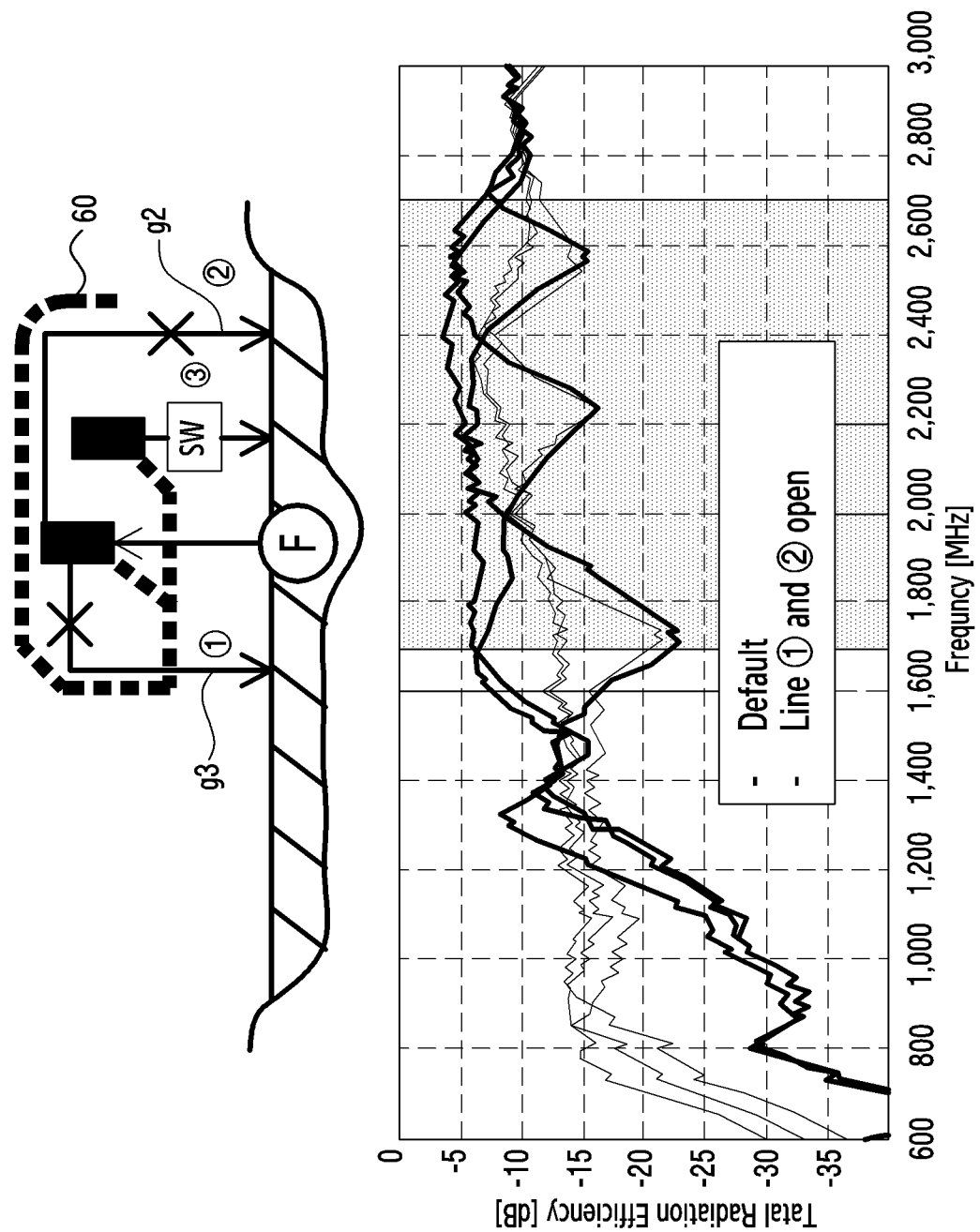
FIG. 16 is a graph representing antenna performance in the case where third and fourth conductive paths and do not exist in the first antenna and antenna performance in the case where the third and fourth conductive paths are added to the first antenna, according to an embodiment.

FIG. 16 is a graph representing antenna performance in the case where the third conductive path g2 and the fourth conductive path g3 do not exist in the first antenna 60 and antenna performance in the case where the third conductive path g2 and the fourth conductive path g3 are added to the first antenna 60. Referring to FIG. 16, it can be seen that in a band between 1700 MHz and 2700 MHz, the performance of the first antenna 60 is good when the third conductive path g2 and the fourth path g3 are added to the first antenna 60.

According to an embodiment, an electronic device includes a housing including a first plate disposed to be oriented in a first direction, a second plate disposed to be oriented in a second direction opposite the first direction, and a side member surrounding a space between the first plate and the second plate and coupled to or integrally formed with the second plate; a display visible through at least part of the first plate; a printed circuit board disposed in the space and including a ground; a first conductive pattern disposed between the printed circuit board and the second plate and including a first portion and a second portion spaced apart from the first portion; an RF communication circuit electrically connected with the first portion and configured to transmit and/or receive at least one signal having a predetermined frequency; a first conductive path electrically connecting the first portion and the RF communication circuit; a second conductive path electrically connecting the second portion and a first position of the ground; a third conductive path electrically connecting the first portion and a second position of the ground; and a fourth conductive path electrically connecting the first portion and a third position of the ground.

The electronic device may further include at least one first conductive connection member included in at least one of the first conductive path, the third conductive path, or the fourth conductive path, and a second conductive connection member included on the second conductive path.

At least part of the third conductive path or the fourth conductive path may be coupled with the first conductive pattern.

The electronic device may further include at least one first switch disposed on the second conductive path.

The first position, the second position, and the third position may be spaced apart from each other.

The electronic device may further include an insulative member between the second plate and the printed circuit board, and the first conductive pattern may be disposed on the insulative member.

The first conductive pattern may be disposed close to a first electronic component including a conductive constituent element.

The first electronic component may include a speaker, an earphone jack connection device, a USB connector, a camera, or a sensor.

The electronic device may further include a second conductive pattern spaced apart from the first conductive pattern and including a third portion and a fourth portion spaced apart from the third portion; a fifth conductive path electrically connecting the RF communication circuit and the third portion; a sixth conductive path electrically connecting the fourth position of the ground and the fourth portion; and a seventh conductive path electrically connecting the fifth position of the ground and the third portion.

The electronic device may further include at least one third conductive connection member disposed between the third portion and the printed circuit board and included in at least one of the fifth conductive path or the seventh conductive path; and a fourth conductive connection member disposed between the fourth portion and the printed circuit board and included on the sixth conductive path.

The electronic device may further include at least one second switch disposed in the sixth conductive path.

The second conductive pattern may be disposed close to a second electronic component including a conductive constituent element.

The second electronic component may include a speaker, an earphone jack connection device, a USB connector, a camera, or a sensor.

At least part of the seventh conductive path may be coupled with the second conductive pattern.

The electronic device may further include a rear case between the second plate and the printed circuit board, and the rear case may include the insulative member.

According to an embodiment, an electronic device includes a printed circuit board including a ground and an RF communication circuit; a rear case disposed to face the printed circuit board; and an antenna device disposed between the printed circuit board and the rear case. The antenna device may include a first antenna for intermediate and high bands and a second antenna for a low band, the second antenna being spaced apart from the first antenna. The first antenna includes a first antenna radiation pattern including a first portion and a second portion spaced apart from the first portion, and disposed on one surface of the rear case; a first conductive connection member disposed between the first portion and the printed circuit board; a second conductive connection member disposed between the second portion and the printed circuit board; a first power-feeding line that electrically connects the RF communication circuit and the first conductive connection member so as to feed power; a first ground line electrically connecting the second conductive connection member and the ground so as to ground the first antenna radiation pattern; a second ground line electrically connecting the second conductive connection member and the ground so as to ground the first antenna radiation pattern; and a third ground line electrically connecting the first conductive connection member and the ground so as to ground the first antenna radiation pattern.

The second antenna includes a second antenna radiation pattern including a third portion and a fourth portion, the fourth portion being spaced apart from the third portion and disposed on one surface of the rear case; a third conductive connection member disposed between the third portion and the printed circuit board; a fourth conductive connection member disposed between the fourth portion and the printed circuit board; a second power-feeding line electrically connecting the third conductive connection member and the RF communication circuit so as to feed power to the second antenna radiation pattern; a fourth ground line electrically connecting the fourth conductive connection member and the printed circuit board so as to ground the second antenna radiation pattern; and a fifth ground line electrically connecting the third conductive connection member and the printed circuit board so as to ground the second antenna radiation pattern.

The intermediate and high bands include a frequency band between 1700 MHz and 2700 MHz.

The electronic device may further include a first switch disposed between the second conductive connection member and the printed circuit board; and a second switch disposed between the fourth conductive connection member and the printed circuit board.

The first antenna radiation pattern may include a first portion in which electrical coupling with the second ground line occurs; and a second portion in which electrical coupling with the third ground line occurs.

The second antenna radiation pattern may include a third portion that is electrically coupled with the fifth ground line.

While the present disclosure has been particularly shown and described with reference to certain embodiments thereof, it will be understood by those of ordinary skill in the art that various changes in form and details may be made therein without departing from the spirit and scope of the disclosure as defined by the appended claims and their equivalents.

What is claimed is:

1. An electronic device comprising:
a housing including a first plate disposed to be oriented in a first direction, a second plate disposed to be oriented in a second direction opposite the first direction, and a side member surrounding a space between the first plate and the second plate and coupled to or integrally formed with the second plate;
a display visible through at least part of the first plate;
a printed circuit board (PCB) disposed in the space and including a ground; and
an antenna device disposed on the PCB and the second plate,
wherein the antenna device includes a first antenna for intermediate and high bands and a second antenna for a low band, the second antenna being spaced apart from the first antenna,
wherein the first antenna includes:
a first conductive pattern disposed between the PCB and the second plate and including a first portion and a second portion spaced apart from the first portion;
a radio frequency (RF) communication circuit electrically connected with the first portion and configured to transmit or receive at least one signal having a predetermined frequency;
a first conductive path electrically connecting the first portion and the RF communication circuit;
a second conductive path electrically connecting the second portion and a first position of the ground;
a third conductive path electrically connecting the first portion and a second position of the ground;
a fourth conductive path electrically connecting the first portion and a third position of the ground;
at least one first conductive connection member included in at least one of the first conductive path, the third conductive path, or the fourth conductive path; and
a second conductive connection member included on the second conductive path, and
wherein the second antenna includes:
a second conductive pattern spaced apart from the first conductive pattern and including a third portion and a fourth portion spaced apart from the third portion;
a fifth conductive path electrically connecting the RF communication circuit and the third portion;
a sixth conductive path electrically connecting a fourth position of the ground and the fourth portion;
a seventh conductive path electrically connecting a fifth position of the ground and the third portion;
at least one third conductive connection member disposed between the third portion and the PCB and included in at least one of the fifth conductive path or the seventh conductive path; and
a fourth conductive connection member disposed between the fourth portion and the PCB and included in the sixth conductive path.

2. The electronic device of claim 1, wherein at least part of the third conductive path or the fourth conductive path is coupled with the first conductive pattern.

3. The electronic device of claim 1, further comprising:
at least one first switch disposed on the second conductive path.

4. The electronic device of claim 1, wherein the first position, the second position, and the third position are spaced apart from each other.

5. The electronic device of claim 1, further comprising:
an insulative member disposed between the second plate and the PCB,
wherein the first conductive pattern is disposed on the insulative member.

6. The electronic device of claim 1, wherein the first conductive pattern is disposed close to an electronic component including a conductive constituent element.

7. The electronic device of claim 6, wherein the electronic component includes a speaker, an earphone jack connection device, a universal serial bus (USB) connector, a camera, or a sensor.

8. The electronic device of claim 1, further comprising:
at least one second switch disposed on the sixth conductive path.

9. The electronic device of claim 1, wherein the second conductive pattern is disposed close to an electronic component including a conductive constituent element.

10. The electronic device of claim 9, wherein the electronic component includes a speaker, an earphone jack connection device, a universal serial bus (USB) connector, a camera, or a sensor.

11. The electronic device of claim 1, wherein at least part of the seventh conductive path is coupled with the second conductive pattern.

12. The electronic device of claim 1, further comprising:
a rear case between the second plate and the PCB,
wherein the rear case includes an insulative member.

13. An electronic device comprising:
a printed circuit board (PCB) including a ground and a radio frequency (RF) communication circuit;
a rear case disposed to face the PCB; and
an antenna device disposed on the PCB and the rear case,
wherein the antenna device includes a first antenna for intermediate and high bands and a second antenna for a low band, the second antenna being spaced apart from the first antenna,
wherein the first antenna includes:
a first antenna radiation pattern including a first portion and a second portion spaced apart from the first portion, and disposed on one surface of the rear case;
a first conductive connection member disposed between the first portion and the PCB;
a second conductive connection member disposed between the second portion and the PCB;
a first power-feeding line that electrically connects the RF communication circuit and the first conductive connection member so as to feed power;
a first ground line electrically connecting the second conductive connection member and the ground so as to ground the first antenna radiation pattern;

a second ground line electrically connecting the first conductive connection member and the ground so as to ground the first antenna radiation pattern; and a third ground line electrically connecting the first conductive connection member and the ground so as to ground the first antenna radiation pattern, and wherein the second antenna includes:

a second antenna radiation pattern including a third portion and a fourth portion spaced apart from the third portion and disposed on the one surface of the rear case;

a third conductive connection member disposed between the third portion and the PCB;

a fourth conductive connection member disposed between the fourth portion and the PCB;

a second power-feeding line electrically connecting the third conductive connection member and the RF communication circuit so as to feed power to the second antenna radiation pattern;

a fourth ground line electrically connecting the fourth conductive connection member and the PCB so as to ground the second antenna radiation pattern; and a fifth ground line electrically connecting the third conductive connection member and the PCB so as to ground the second antenna radiation pattern.

14. The electronic device of claim 13, wherein the intermediate and high bands include a frequency band between 1700 megahertz (MHz) to 2700 MHz.

15. The electronic device of claim 13, further comprising:

a first switch disposed between the second conductive connection member and the PCB; and a second switch disposed between the fourth conductive connection member and the PCB.

16. The electronic device of claim 13, wherein the first antenna radiation pattern includes:

a first region in which electrical coupling with the second ground line occurs; and a second region in which electrical coupling with the third ground line occurs.

17. The electronic device of claim 13, wherein the second antenna radiation pattern includes a third region which is electrically coupled with the fifth ground line.

* * * * *